(12) United States Patent
Broekaert

(10) Patent No.: US 6,243,435 B1
(45) Date of Patent: Jun. 5, 2001

(54) SYSTEM AND METHOD FOR STORING DIGITAL DATA UTILIZING A RESONANT TUNNELING DIODE BRIDGE

(75) Inventor: Tom P. E. Broekaert, Calabasas, CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/484,501

(22) Filed: Jan. 18, 2000

(51) Int. Cl.[7] .................................................. G11C 19/00
(52) U.S. Cl. ........................... 377/128; 327/195; 326/134
(58) Field of Search ................................ 377/64, 77, 78, 377/79, 80, 81, 128; 327/169, 195; 326/134, 135

(56) References Cited

U.S. PATENT DOCUMENTS

| | | | |
|---|---|---|---|
| 3,054,071 | 9/1962 | Tiemann | 331/107 |
| 3,102,962 * | 9/1963 | Horna | 377/69 |
| 3,152,264 | 10/1964 | Ergott, Jr., et al. | 307/88.5 |
| 3,171,981 | 3/1965 | Wolterman | 307/88.5 |
| 5,198,656 | 3/1993 | Chirovsky | 250/214 |
| 5,444,751 * | 8/1995 | Sage | 377/78 |
| 5,825,240 | 10/1998 | Geis, et al. | 327/570 |
| 5,852,374 | 12/1998 | Frazier | 327/77 |
| 6,008,917 | 12/1999 | Moise et al. | 359/113 |
| 6,037,819 * | 3/2000 | Broekaert | 327/291 |

* cited by examiner

*Primary Examiner*—Tuan T. Lam
(74) *Attorney, Agent, or Firm*—Baker Botts L.L.P.

(57) ABSTRACT

A system for storing digital data includes an input circuit, a clock circuit, and a bridge. The input circuit is coupled to receive an input signal. The clock circuit receives and transmits a clock signal. The bridge stores the digital data and includes a plurality of negative differential resistance devices. The bridge connects to the input circuit and the clock circuit.

25 Claims, 5 Drawing Sheets

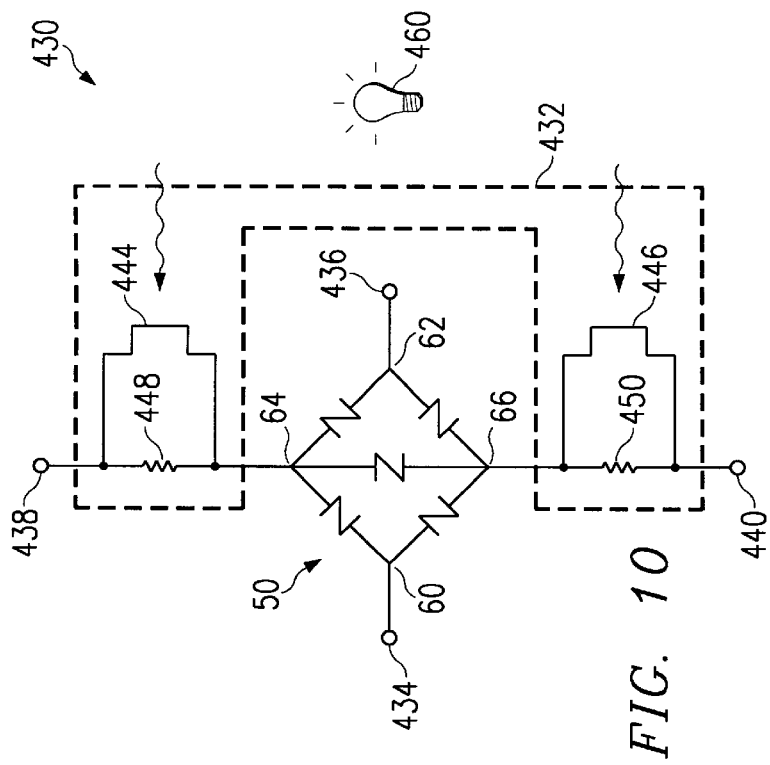
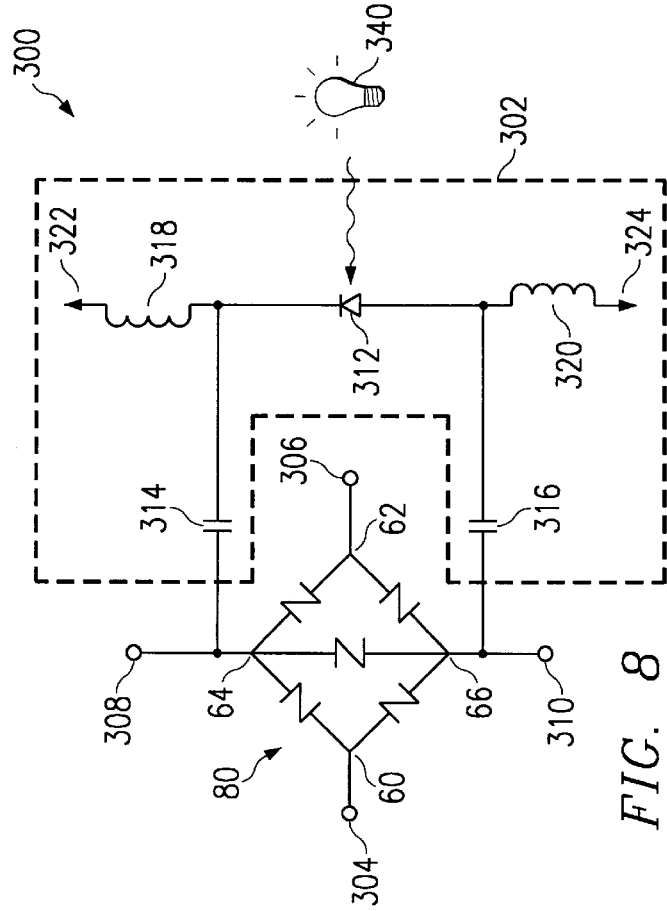
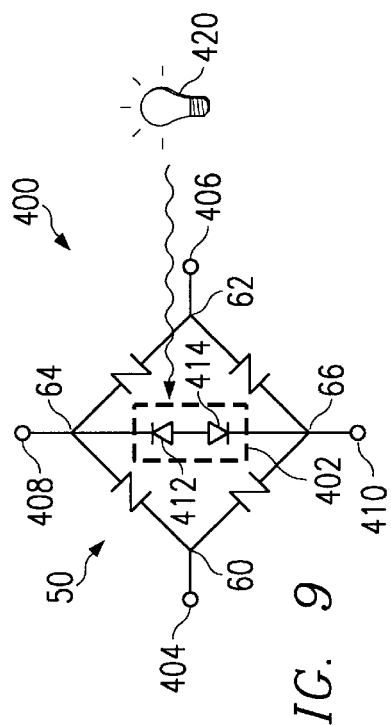
FIG. 10
FIG. 8
FIG. 9

US 6,243,435 B1

SYSTEM AND METHOD FOR STORING DIGITAL DATA UTILIZING A RESONANT TUNNELING DIODE BRIDGE

TECHNICAL FIELD OF THE INVENTION

This invention relates generally to data storage and more particularly to a system and method for storing digital data utilizing a resonant tunneling diode bridge.

BACKGROUND OF THE INVENTION

Shift registers have been formed in a variety of architectures. Conventionally, these architectures have been implemented with transistors. For example, one common implementation uses a D flip-flop that includes master and slave components of cross-coupled depletion-load NOR gates, with each component including six transistors. However, there are several disadvantages associated with using transistors to implement a shift register.

First of all, devices used in digital circuits are becoming smaller and smaller. As these devices decrease in size, quantum mechanical effects begin to appear. The electrical properties of conventional transistors may be altered in an unacceptable way by these quantum mechanical effects. Secondly, a transistor-implemented shift register is limited by the switching speed of the transistors, which may be too slow for some applications.

SUMMARY OF THE INVENTION

In accordance with the present invention, a system and method for storing digital data utilizing a resonant tunneling diode bridge is provided that substantially eliminates or reduces the disadvantages or problems associated with previously developed systems and methods. In particular, the present invention provides data storage by means of a high-speed shift register that utilizes resonant tunneling diodes.

In one embodiment of the present invention, a system for storing digital data is provided that includes a buffer, a clock amplifier, and a bridge. The buffer is coupled to receive an input signal and is operable to modify the input signal. The clock amplifier is coupled to receive a clock signal and is operable to amplify the clock signal. The bridge is operable to store digital data. The bridge includes a plurality of negative differential resistance devices. The bridge is coupled to the buffer and the clock amplifier.

Technical advantages of the present invention include providing an improved, high-speed shift register for data storage. In particular, resonant tunneling diodes are included as a part of a bridge circuit. Accordingly, reliance on transistors is avoided. As a result, the detrimental effects of quantum mechanics are minimized or not present and switching speed is increased.

Other technical advantages of the present invention will be readily apparent to one skilled in the art from the following figures, descriptions, and claims.

BRIEF DESCRIPTION OF THE DRAWINGS

For a more complete understanding of the present invention and its advantages, reference is now made to the following description taken in conjunction with the accompanying drawings:

FIG. 8 is a circuit diagram illustrating a system for phase-locking the bridge of FIG. 5 with an optical pulse in accordance with one embodiment of the present invention;

FIG. 9 is a circuit diagram illustrating a system for phase-locking one of the bridges of FIGS. 3, 4 or 5 with an optical pulse in accordance with one embodiment of the present invention;

FIG. 10 is a circuit diagram illustrating a system for phase-locking one of the bridges of FIGS. 3, 4 or 5 with an optical pulse in accordance with another embodiment of the present invention;

DETAILED DESCRIPTION OF THE INVENTION

The embodiments of the present invention and its advantages are best understood by referring now in more detail to FIGS. 1 through 15 of the drawings, in which like numerals refer to like parts.

Figure 1:
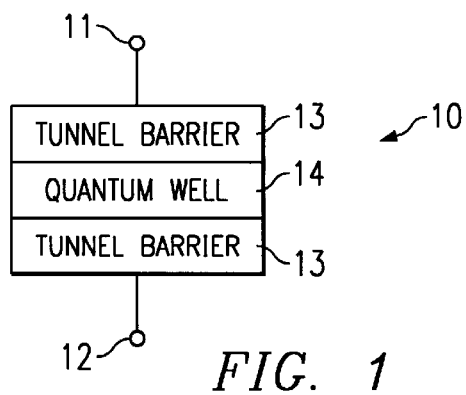
FIG. 1 is a schematic diagram of a resonant tunneling diode (RTD) for use as a negative differential resistance element in accordance with the teachings of the present invention.

FIG. 1 is a schematic diagram of a resonant tunneling diode (RTD) 10 for use as a negative differential resistance element in accordance with the teachings of the present invention. The RTD 10 comprises an input terminal 11 for receiving an input signal, an output terminal 12 for producing an output signal, two tunnel barrier layers 13, and a quantum well layer 14. It will be understood that, due to symmetry, the terminal 11 may be an output terminal for producing an output signal and the terminal 12 may be an input terminal for receiving an input signal.

Figure 2:
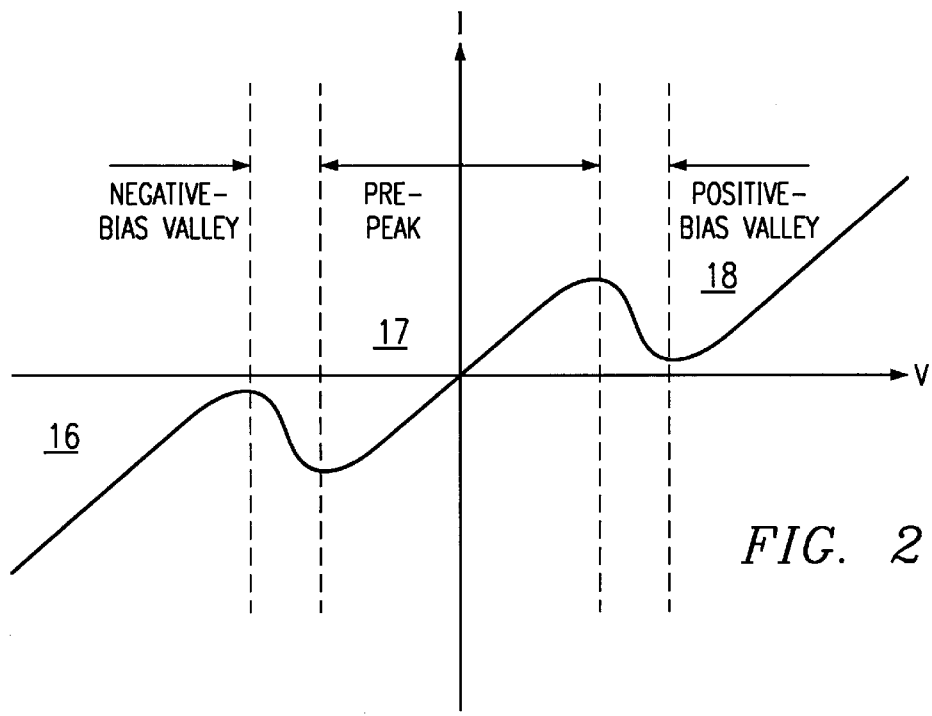
FIG. 2 is a graph of current as a function of voltage for the negative differential resistance element illustrated in FIG. 1.

FIG. 2 is a graph showing current as a function of voltage for a negative differential resistance element such as RTD 10. The shape of this I-V curve is determined by the quantum effects that are a result of the extreme thinness of the tunnel barrier layers 13 and quantum well layer 14. These layers 13 and 14 are approximately ten (10) to twenty (20) atoms thick.

When a voltage of low amplitude is applied to the input terminal 11, almost no electrons tunnel through both tunnel barrier layers 13. This results in a negligible current and the RTD 10 is switched off. As the voltage increases, the energy of the electrons received at the input terminal 11 also increases and the wavelength of these electrons decreases. This occurs because an electron's wavelength is determined by dividing Planck's constant by the electron's momentum. When a particular voltage level is reached at the input terminal 11, a specific number of electron wavelengths will fit within the quantum well layer 14. At this point, resonance is established as electrons that tunnel through one tunnel barrier layer 13 remain in quantum well layer 14, giving those electrons opportunities to tunnel through the second tunnel barrier layer 13 to the output terminal 12. Thus, a current flow is established from the input terminal 11 to the output terminal 12 and the RTD 10 is switched on. However, if the voltage level continues to rise, eventually no electrons will have the proper wavelength to tunnel through the tunnel barrier layers 13 and the RTD 10 is switched off. This property of negative differential resistance elements such as RTDs 10 that allows switching back and forth between on and off states as the voltage increases enables biasing to operate in one of three stable states, as illustrated in FIG. 2. These three stable states are the negative-bias valley region 16, the pre-peak region 17, and the positive-bias valley region 18.

Another property associated with the extreme thinness of the tunnel barrier layers 13 and quantum well layer 14 of the RTD 10 relates to switching speed. Because each of these layers 13 and 14 are only about ten (10) to twenty (20) atoms thick, an electron only travels about 0.01 microns from the input terminal 11 to the output terminal 12. Because of this short distance, the RTD 10 switches on and off at a very high rate.

Figure 3:
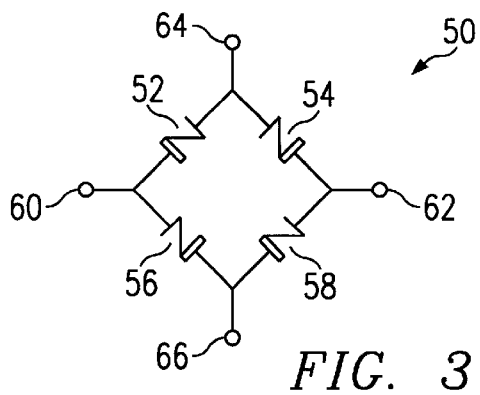
FIGS. 3, 4 and 5 are circuit diagrams illustrating a bridge for quantizing an analog signal in accordance with the teachings of the present invention.
Figure 4:
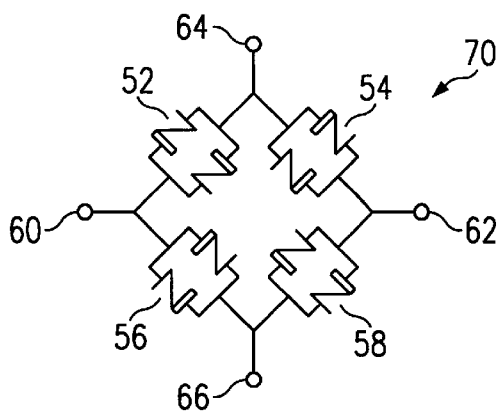
Figure 5:
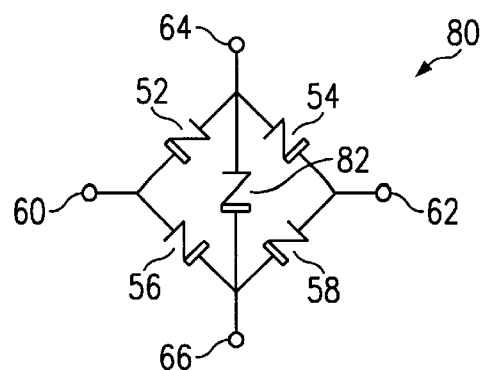

FIGS. 3, 4 and 5 are circuit diagrams illustrating bridges 50, 70 and 80 for quantizing an analog signal for digital data storage in accordance with the present invention. The bridges 50, 70 and 80 comprise a first RTD 52, a second RTD 54, a third RTD 56, and a fourth RTD 58. Each RTD comprises a substrate side illustrated in FIGS. 3–5 with a rectangle along one side. The bridges 50, 70 and 80 also comprise an input terminal 60 for receiving an analog input signal, an inverted input terminal 62 for receiving an inverted input signal, a clock terminal 64 for receiving a clock signal, and an inverted clock terminal 66 for receiving an inverted clock signal. In an alternative embodiment, the inverted input terminal 62 for receiving an inverted input signal may be a reference terminal for receiving a reference signal.

In the embodiment shown in FIG. 3, each RTD 52, 54, 56 and 58 is biased the same with respect to the clock terminal 64. In the embodiment shown in FIG. 4, each RTD 52, 54, 56 and 58 comprises a diode pair in parallel and biased oppositely to each other. The bridge 80 shown in FIG. 5 comprises a fifth RTD 82. In this embodiment, each RTD 52, 54, 56, 58 and 82 is biased the same with respect to the clock terminal 64. However, as an alternative, each RTD 52, 54, 56, 58 and 82 may comprise an RTD pair in parallel and biased oppositely to each other.

In bridges 50 and 70, the RTDs 52, 54, 56 and 58 operate in the pre-peak region 17, see FIG. 2, when the input current is zero. This produces an output signal of zero. When the input current reaches a specified level, an asymmetry results that triggers the bridge 50 or 70, resulting in the production of an output signal of –1 or +1.

A determination regarding whether the output signal will be –1 or +1 is made when the clock signal level increases. In this situation, the bridges 50 and 70 become positively biased and two of the RTDs 52, 54, 56 and 58 switch to either the negative-bias valley region 16, producing an output signal of –1, or the positive-bias valley region 18, producing an output signal of +1. If the input current level causes the RTD 52 to switch, the RTD 58 will also switch. However, if the input current level causes the RTD 54 to switch, the RTD 56 will be the second one to switch. If the RTDs 52 and 58 switch, the output signal will be +1, while if the RTDs 54 and 56 switch, the output signal will be –1.

A determination regarding whether the output signal will be –1 or +1 is also made when the clock signal level is negative and increasing in amplitude. In this situation, the bridges 50 and 70 become negatively biased and two of the RTDs 52, 54, 56, and 58 are forced into either the negative-bias valley region 16, see FIG. 2, or the positive-bias valley region 18 as just described in connection with a clock signal increase. As before, either the RTDs 52 and 58 or the RTDs 54 and 56 will switch. In this case, however, if the RTDs 52 and 58 switch, the output signal will be –1, while if RTDs 54 and 56 switch, the output signal will be +1.

When the clock signal level is zero, the current through the RTDs 52, 54, 56 and 58 drops, forcing the bridges 50 and 70 back into the pre-peak region 17. Thus, each time the clock is low, the bridges 50 and 70 are reset and the output signal is zero. An exception to this occurs when input current levels are relatively high. However, in this situation, the strength of the input current assures the proper output signal.

In bridge 80, the fifth RTD 82 creates an asymmetry that forces one of the pair of RTDs either 52 and 58 or 54 and 56 into the negative-bias valley region 16 or the positive-bias valley region 18. In this configuration, there is essentially no input signal that will result in an output signal of zero upon applying the clock signal. This is because an input that would result in an output of zero places the bridge 80 into an unstable state so that even a slight asymmetry moves the bridge 80 out of the pre-peak region 17 when the clock signal level increases. Although the RTDs 52, 54, 56, 58 and 82 can be designed for symmetry, the inherent physical differences between the RTDs 52, 54, 56, 58 and 82 result in a nearly inevitable asymmetry which is generally sufficient to move the bridge 80 out of the pre-peak region 17. Thus, for the embodiment in which the bridge 80 comprises a fifth RTD 82, the output signal produced is binary instead of ternary. However, as with bridges 50 and 70, bridge 80 is reset each time the clock is low.

Bridge 80 also operates to produce an output signal both when the clock bias is positive and when the clock bias is negative, as with bridges 50 and 70. Therefore, with each clock cycle, the bridges 50, 70 and 80 are triggered twice, resulting in the production of two outputs. Thus, in order to obtain 25 gigasamples per second, for example, a 12.5 gigahertz clock is sufficient.

The embodiments shown in FIGS. 3 and 5, where the bridges 50 and 80 comprise single RTDs 52, 54, 56, 58 and 82, provide a more compact layout that operates at a higher speed than the embodiment shown in FIG. 4, where each RTD 52, 54, 56 and 58 comprises a pair. However, the embodiment shown in FIG. 4 provides more symmetry and reduces even-order harmonics that may exist in the embodiments shown in FIGS. 3 and 5.

Figure 6A:
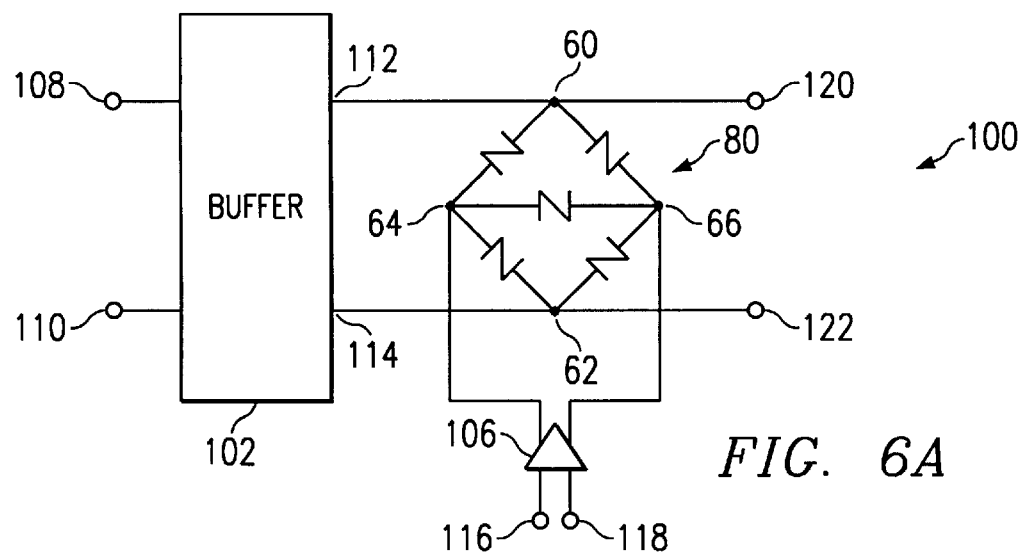
FIG. 6A is a circuit diagram illustrating a system for storing data utilizing the bridge of FIG. 5 in accordance with one embodiment of the present invention.

FIG. 6A is a circuit diagram illustrating a system 100 for storing data utilizing the bridge 80 of FIG. 5 in accordance with one embodiment of the present invention. As described above in connection with FIG. 5, each arm of the bridge 80 may comprise a single negative differential resistance device that is biased the same or pairs of negative differential resistance devices in parallel that are biased oppositely to each other. The system 100 comprises the bridge 80, a buffer 102 and a clock amplifier 106. The system 100 also comprises a buffer input 108, an inverted buffer input 110, a buffer output 112, an inverted buffer output 114, a clock input 116, an inverted clock input 118, a system output 120 and an inverted system output 122.

Figure 6B:
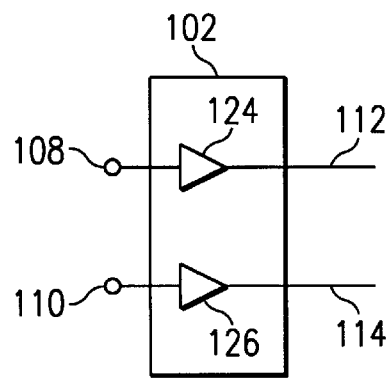
FIGS. 6B–C are circuit diagrams illustrating embodiments of the buffer shown in FIG. 6A in accordance with the teachings of the present invention.
Figure 6C:
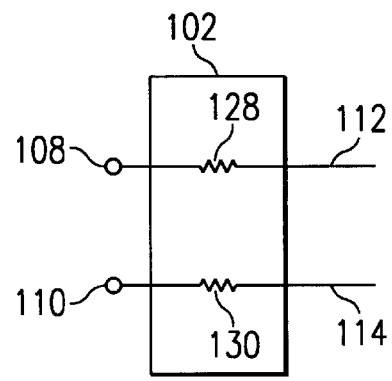

According to the embodiment shown in FIG. 6B, the buffer 102 comprises an input follower 124 and an inverted input follower 126. Alternatively, the buffer 102 may comprise resistors 128 and 130, as shown in FIG. 6C, or other suitable components operable to modify the input signals. For the embodiment in which the buffer 102 comprises followers 124 and 126, signals are received at the buffer inputs 108 and 110 and buffered signals are generated at the buffer outputs 112 and 114. Thus, the followers 124 and 126 provide direction by allowing signals to pass from the buffer inputs 108 and 110 to the buffer outputs 112 and 114, while preventing signal transmission from the buffer outputs 112 and 114 to the buffer inputs 108 and 110. According to one embodiment, the followers 124 and 126 comprise operational amplifiers with a gain of approximately 1. However, it will be understood that the followers 124 and 126 may also comprise single-stage field-effect transistor amplifiers, integrated circuit metal-oxide semiconductor amplifiers or other suitable amplifiers without departing from the scope of the present invention. The output impedance of the buffer 102 is typically designed to be higher than the impedance presented by the RTDs 52, 54, 56, 58 and/or 82 and the clock amplifier 106. This reduces the amount of analog signal feedthrough relative to the clock signal.

In one embodiment, the input comprises a voltage varying signal received at the buffer input 108. The inverted input signal is received at the inverted buffer input 110. In an alternative embodiment, the inverted buffer input 110 may be a reference terminal for receiving a reference signal. The input signal is applied to the input follower 124, and the inverted input signal is applied to the inverted input follower 126. The buffer output 112 is coupled to the input terminal 60 of the bridge 80, and the inverted buffer output 114 is coupled to the inverted input terminal 62 of the bridge 80.

Similarly, the clock signal is received at the clock input 116, and the inverted clock signal is received at the inverted clock input 118. The clock signal and the inverted clock signal are applied to the clock amplifier 106 having outputs applied to the clock terminal 64 and the inverted clock terminal 66, respectively. According to one embodiment, the clock amplifier 106 comprises a transconductance amplifier. It will be understood, however, that the clock amplifier may comprise any other suitable amplifier without departing from the scope of the present invention.

An output signal from the system 100 is provided at the system output 120 and an inverted output signal is provided at the inverted system output 122. According to one embodiment, the output comprises a current varying signal. The system output 120 is coupled to the input terminal 60 of the bridge 80, and the inverted system output 122 is coupled to the inverted input terminal 62.

In operation, as the result of a higher output impedance, the buffer 102 modifies the input and inverted input signals so that the buffer output and the inverted buffer output are at a level sufficient to set the system output 120 and the inverted system output 122 during the clock transitions, but at a level that prevents strong analog feedthrough during stable clock levels. This allows the impedance of the bridge 80 to set the output when the clock is stable.

As described above in connection with FIGS. 3, 4 and 5, when the clock is low, the bridge 80 is reset and the output is zero. As the clock goes high, however, the weak signal from the buffer 102 results in an asymmetry at the bridge 80. As described in more detail above, due to an impedance mismatch, even a slight asymmetry is sufficient to trigger the bridge 80, allowing the bridge 80 to move into the negative-bias valley region 16 or the positive-bias valley region 18. When the clock is high, however, the output is determined by the bridge 80, as opposed to the signal from the buffer 102. Thus, the output signal remains the same as the output determined during the previous clock transition. When the clock returns to low, the bridge 80 is again reset and the output becomes zero. Thus, the input signals are modified enough by the buffer 102 so that the output signals are substantially unaffected while the clock is stable, but the input signals remain at a level that is capable of affecting the output signals during clock transitions.

In accordance with the described embodiment, the system 100 may be in one of three phases: read, hold or reset. In one embodiment, when the clock is rising, the system 100 is in a read phase, as the input signals set the output signals at either +1 or −1. When the clock is high, the system 100 is in a hold phase, as the output signals remain unchanged despite moderate changes in the input signals. Finally, when the clock is low, the system 100 is in a reset phase, as the output signals are forced to zero to clear the previous output. The system 100 then returns to a read phase and continues through the cycle indefinitely.

As described above in connection with FIG. 5, the bridge 80 operates to determine the value of the output signal both when the clock bias is positive and increasing in magnitude and when the clock bias is negative and increasing in magnitude. Therefore, the system 100 produces two outputs for each clock cycle. Thus, in order to obtain 25 gigasamples per second, for example, a 12.5 gigahertz clock is sufficient.

Figure 7:
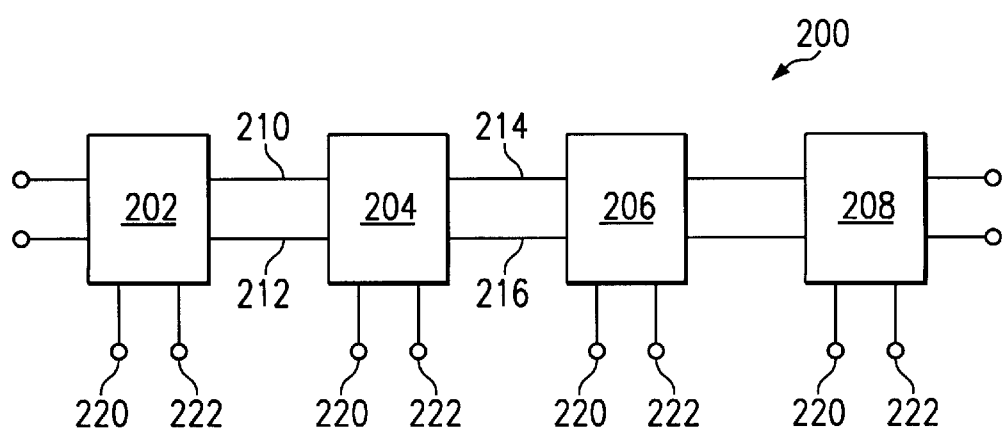
FIG. 7 is a block diagram illustrating a shift register constructed in accordance with the teachings of the present invention.

FIG. 7 is a block diagram illustrating a shift register 200 constructed in accordance with the teachings of the present invention. The shift register 200 includes a plurality of stages 202, 204, 206 and 208. In accordance with one embodiment of the present invention, each stage 202, 204, 206 and 208 comprises the system 100 of FIG. 6.

In one embodiment, stage 204 receives from stage 202 an input signal on line 210 and an inverted input signal on line 212. Stage 204 passes to stage 206 an output signal on line 214 and an inverted output signal on line 216. Stage 206 similarly passes signals to stage 208. It will be understood that any number of stages may be coupled is together in this manner without departing from the scope of the present invention. Stages 202, 204, 206 and 208 receive clock signals at lines 220 and inverted clock signals at lines 222.

For the embodiment in which the stages 202, 204, 206 and 208 each comprise the system 100 of FIGS. 6A and 6B, the clock signal received at an adjacent stage is 90 degrees out of phase with the clock signals received at the previous stage. For example, when the clock signal received at stage 202 is at zero degrees, the clock signal received at stage 204 is at 90 degrees. For simplicity, the same clock signal received at stage 202 may be received at stage 206, and the same clock signal received at stage 204 may be received at stage 208. In this situation, the clock signal received at stage 206 is at zero degrees, and the clock signal received at stage 208 is at 90 degrees. Thus, adjacent stages 202, 204, 206 and/or 208 are each 90 degrees out of phase with each other.

This staggering of the clock signals allows data to be shifted from one stage to the next without being lost. For example, while stage 202 is in a hold phase, stage 204 is in a read phase. Thus, the outputs from stage 202 are held on lines 210 and 212 as inputs for stage 204 while stage 204 is in a read phase. At this time, stage 206 is also in a hold phase, while stage 208 is in a read phase.

As the clock signals all progress 90 degrees out of phase with each other, stage 204 moves into a hold phase after generating a new output based on the input received from stage 202. Stage 206 then moves into a read phase. Thus, the outputs from stage 204 are now held on lines 214 and 216 as inputs for stage 206. In this manner, each stage 202, 204, 206 and 208 reads an input and then holds an output in synchronization with adjacent stages 202, 204, 206 and/or 208 so that each bit of data is shifted through each stage 202, 204, 206 and 208 without being lost.

In the embodiment in which the stages 202, 204, 206 and 208 comprise systems similar to the system 100 of FIGS. 6A and 6C, the stages 202, 204, 206 and 208 are each 60 degrees out of phase with the adjacent stages.

Thus, for a bit of data being shifted from left to right through the shift register 200, when the clock signal received at stage 202 is at zero degrees, the clock signal received at stage 204 is at 60 degrees and the clock signal received at stage 206 is at 120 degrees. As with the previously described embodiment, for simplicity the same clock signal may be received at multiple stages 202, 204, 206 and/or 208. In this embodiment, the same clock signal received at stage 202 is received at stage 208. Thus, the clock signal received at stage 208 is at zero degrees when the clock signal at stage 202 is at zero degrees.

In this embodiment, the resistors 128 and 130 will not provide direction control for the signals as provided by the followers 124 and 126 in the previously described embodiment. Thus, staggering the clock signals by 60 degrees instead of 90 degrees provides the signal direction control in this embodiment. The staggered clock signals ensure that the stages 202, 204, 206 and 208 are in the proper phase so that the adjacent stages 202, 204, 206 and/or 208 are receiving inputs or providing outputs at the correct times for passing a bit of data from left to right through the shift register 200. Thus, the stages 202, 204, 206 and 208 are in a hold-read-reset pattern from left to right. For example, while stage 204 is in a hold phase, stage 206 is in a read phase and stage 208 is in a reset phase.

Without this direction control, the stages 202, 204, 206 and 208 could be in a hold-reset-read pattern from left to right. In this situation, the bit of data would be shifted through the shift register 200 from right to left instead of from left to right. It will be understood that the direction provided by the staggered clock signals enable intentional shifting of a bit of data from right to left through the shift register 200. For this embodiment, the clock signal received at stage 202 is at 120 degrees when the clock signal received at stage 204 is at 60 degrees and the clock signal received at stage 206 is at zero degrees.

The clock signals received at stages 200, 202, 204 and 206 may be generated by oscillators, as described in more detail below in connection with FIGS. 11–15. In particular, multi-phase clock signals may be generated as described in connection with FIGS. 15A–C.

As described in more detail below, FIGS. 8, 9 and 10 are circuit diagrams illustrating systems 300, 400 and 430 for phase-locking an optical pulse with a bridge 50, 70 or 80 in accordance with the teachings of the present invention. An optical pulse can be extremely narrow with low jitter as compared to a conventional clock signal. Low jitter is important in applications such as analog-to-digital converters, as well as others. The systems 300, 400 and 430 provide this advantage to the clock signals received at the bridges 50, 70 or 80.

According to one embodiment of the present invention, infrared or visible light sources 340, 420 and 460 provide a series of optical pulses that are injected into the bridges 50, 70 and 80. These optical pulses, either alone or in conjunction with a conventional clock signal, trigger the bridges 50, 70 and 80, allowing the bridges 50, 70 and 80 to move out of the pre-peak region 17. According to one embodiment of the present invention, an electrical signal is provided to the systems 300, 400 and 430 in order to generate both the optical signal and the clock signal. Alternatively, the optical signal generates the clock signal. It will be understood, however, that the optical signal and the clock signal may be otherwise generated without departing from the scope of the present invention.

FIG. 8 is a circuit diagram illustrating a system 300 for phase-locking a bridge 80 with an optical pulse in accordance with one embodiment of the present invention. The system 300 comprises the bridge 80 and an optical pulse injector 302. As described above in connection with FIG. 5, each arm of the bridge 80 may comprise a single negative differential resistance device that is biased the same or pairs of negative differential resistance devices in parallel that are biased oppositely to each other.

The system 300 also comprises an input terminal 304, an inverted input terminal 306, a clock terminal 308, and an inverted clock terminal 310. In one embodiment, the input comprises a voltage varying signal received at the input terminal 304. The inverted input signal is received at the inverted input terminal 306. In an alternative embodiment, the inverted input terminal 306 may be a reference terminal for receiving a reference signal. Similarly, the clock signal is received at the clock terminal 308, and the inverted clock signal is received at the inverted clock terminal 310.

The optical pulse injector 302 comprises a PIN diode 312, two capacitors 314 and 316, two inductors 318 and 320, and two power supply terminals 322 and 324. According to one embodiment, both power supply terminals 322 and 324 are coupled to power supplies. Alternatively, one of the power supply terminals 322 or 324 is coupled to a power supply, and the other power supply terminal 322 or 324 is grounded. The power supply terminals 322 and 324 provide a DC bias for the PIN diode 312. The capacitors 314 and 316 shield the bridge 80 from the DC signal provided by the power supply terminals 322 and 324 so that the bridge 80 is essentially unaffected by the power supplies.

The system 300 also comprises a light source 340 for producing an optical pulse. The optical pulse from the light source 340 impinges on the optical pulse injector 302, causing an optically-induced AC signal to flow through the PIN diode 312. This AC signal is provided to the bridge 80 by way of the capacitors 314 and 316. The inductors 318 and 320 prevent the AC signal from traveling to the power supply terminals 322 and 324, thereby maximizing the amount of current provided to the bridge 80 from the PIN diode 312 in response to an optical pulse. The amount of optically-induced current, in addition to the current provided by the clock signal, is sufficient to trigger the bridge 80, allowing the bridge 80 to move into the negative-bias valley region 16 or the positive-bias valley region 18. Therefore, the bridge 80 is moved out of the pre-peak region 17 when the light source 340 provides an optical pulse to the PIN diode 312.

According to one embodiment of the present invention, the high level of the clock signal is insufficient to trigger the bridge 80. The optical pulse provided by the light source 340 causes the PIN diode 312 to provide enough additional current to trigger the bridge 80. In this embodiment, the high level of the clock signal is sufficient to maintain the output produced by the system 300 after the optical pulse has passed. As described in more detail above, the output is maintained until the clock signal goes low and returns the bridge 80 to the pre-peak region 17.

In an alternative embodiment, the clock signal is maintained at a low, or zero, level. In this embodiment, the optical pulse is strong enough to result in a sufficient amount of current being provided by the PIN diode 312 to trigger the bridge 80. However, in this embodiment, once the current is no longer provided as the optical pulse goes low, the bridge 80 will no longer remain in the negative-bias valley region 16 or the positive-bias valley region 18, but will be reset and return to the pre-peak region 17. Thus, the output produced by the system 300 is available for a shorter amount of time in this embodiment as compared to the previously described embodiment with a higher clock signal.

FIG. 9 is a circuit diagram illustrating a system 400 for phase-locking a bridge 50 with an optical pulse in accordance with one embodiment of the present invention. As an alternative to bridge 50, the system 400 may comprise bridge 70 or 80. Thus, the system 400 may include a bridge with either four or five arms, and each arm of the bridge may comprise a single negative differential resistance device that is biased the same or pairs of negative differential resistance devices in parallel that are biased oppositely to each other. For the embodiment shown in FIG. 9, the system 400 comprises the bridge 50, an optical pulse injector 402, an input terminal 404, an inverted input terminal 406, a clock terminal 408, and an inverted clock terminal 410.

In one embodiment, the input comprises a voltage varying signal received at the input terminal 404. The inverted input signal is received at the inverted input terminal 406. In an alternative embodiment, the inverted input terminal 406 may be a reference terminal for receiving a reference signal. Similarly, the clock signal is received at the clock terminal 408, and the inverted clock signal is received at the inverted clock terminal 410.

According to the embodiment shown in FIG. 9, the optical pulse injector 402 comprises a first PIN diode 412 and a second PIN diode 414. The PIN diodes 412 and 414 are biased oppositely to each other. The first PIN diode 412 is forward-biased and the second PIN diode 414 is reverse-biased. Alternatively, the first PIN diode 412 may be reverse-biased and the second PIN diode 414 may be forward-biased.

The system 400 also comprises a light source 420 for producing an optical pulse. The optical pulse from the light source 420 impinges on the optical pulse injector 402, causing current to flow through the PIN diodes 412 and 414. Because the PIN diodes 412 and 414 are biased oppositely to each other, the optically-induced current generated by each PIN diode 412 and 414 should be unequal. In accordance with one embodiment, the optically-induced current generated by the reverse-biased diode 414 should be larger than the optically-induced current generated by the forward-biased diode 412.

The system 400 of FIG. 9 avoids the biasing circuitry of the system 300 shown in FIG. 8, i.e., the inductors 318 and 320 and the power supply terminals 322 and 324. However, without this biasing circuitry, the clock signal must be capable of generating sufficient bias for the PIN diodes 412 and 414 to operate properly. In addition, the system 400 of FIG. 9 is a bi-polar system that operates on both phases of the clock, as opposed to the uni-polar system of FIG. 8 that operates on only one phase of the clock.

FIG. 10 is a circuit diagram illustrating a system 430 for phase-locking a bridge 50 with an optical pulse in accordance with another embodiment of the present invention. As an alternative to bridge 50, the system 430 may comprise bridge 70 or 80. Thus, the system 430 may include a bridge with either four or five arms, and each arm of the bridge may comprise a single negative differential resistance device that is biased the same or pairs of negative differential resistance devices in parallel that are biased oppositely to each other. For the embodiment shown in FIG. 10, the system 430 comprises the bridge 50, an optical pulse injector 432, an input terminal 434, an inverted input terminal 436, a clock terminal 438, and an inverted clock terminal 440.

In one embodiment, the input comprises a voltage varying signal received at the input terminal 434. The inverted input signal is received at the inverted input terminal 436. In an alternative embodiment, the inverted input terminal 436 may be a reference terminal for receiving a reference signal. Similarly, the clock signal is received at the clock terminal 438, and the inverted clock signal is received at the inverted clock terminal 440.

According to the embodiment shown in FIG. 10, the optical pulse injector 432 comprises a first metal-semiconductor-metal (MSM) photodetector 444, a second MSM photodetector 446, and two resistors 448 and 450. According to one embodiment, the resistors 448 and 450 are each approximately the same order of magnitude as the pre-peak impedance of the RTDs 52, 54, 56, 58 and/or 82. When no light is present, the resistance of the MSM photodetectors 444 and 446 is relatively high as the semiconductor is behaving as an insulator. This results in a negligible amount of current flowing through the MSM photodetectors 444 and 446. However, when light impinges on the MSM photodetectors 444 and 446, the resistance of the MSM photodetectors 444 and 446 is decreased as the light causes the semiconductor to behave as a conductor. This results in current flowing through the MSM photodetectors 444 and 446.

Thus, the system 430 also comprises a light source 460 for producing an optical pulse. The optical pulse from the light source 460 impinges on the optical pulse injector 432, causing current to flow through the MSM photodetectors 444 and 446. This current triggers the bridge 50, allowing the bridge 50 to move out of the pre-peak region 17.

In order for the system 430 of FIG. 10 to function properly, the MSM photodetectors 444 and 446 should receive optical pulses at substantially the same time. This ensures that the appropriate signals are received at the clock terminal 64 and the inverted clock terminal 66 of the bridge 50 essentially simultaneously.

Figure 11:
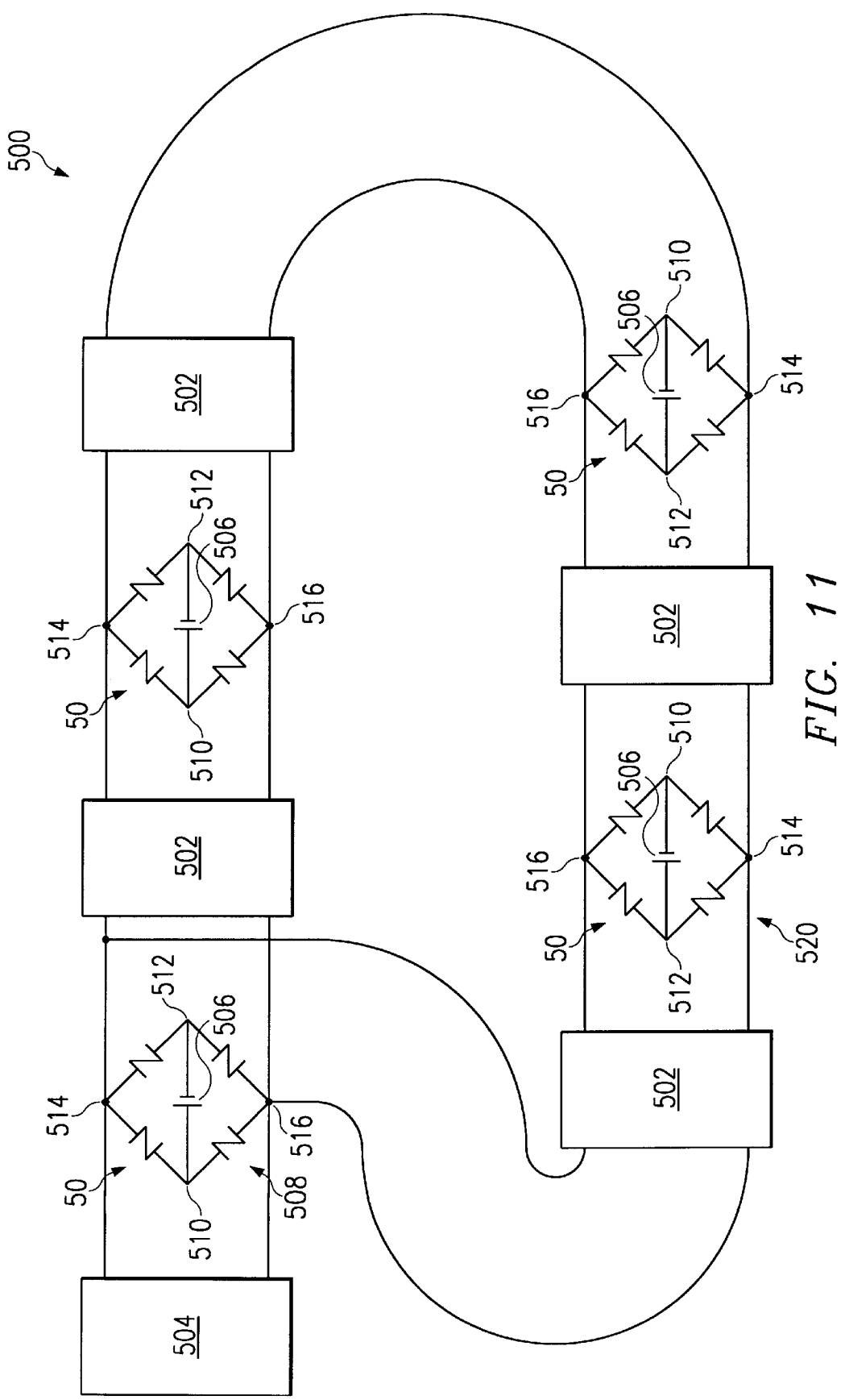
FIG. 11 is a circuit diagram illustrating an oscillator utilizing one of the bridges of FIGS. 3, 4 or 5 in accordance with one embodiment of the present invention.

FIG. 11 is a circuit diagram illustrating an oscillator 500 utilizing bridges 50 in accordance with one embodiment of the present invention. In an alternative embodiment, the oscillator 500 utilizes bridges 70 or 80, as illustrated in FIGS. 4 and 5, instead of bridges 50. In addition to bridges 50, the oscillator 500 comprises transmission lines 502, a phase-locking clock circuit 504 and a power supply 506. The bridges 50 are coupled to each other through the transmission lines 502 to form a ring, as illustrated in FIG. 11. The bridges 50 provide gain to compensate for signal loss as the signal travels through the oscillator 500, while the transmission lines 502 provide phase shifts, or delays, between adjacent bridges 50. As described in more detail below in connection with FIGS. 15A–C, the phase shifts provided by the transmission lines 502 allow the oscillator 500 to produce multi-phase output signals. These multi-phase output signals may be used, for example, as multi-phase clock signals in applications such as the shift register 200 described above in connection with FIG. 7. It will be understood that the multi-phase outputs may be used for any other suitable application without departing from the scope of the present invention.

Each bridge 50 comprises an input terminal 510, and inverted input terminal 512, a clock terminal 514, and an inverted clock terminal 516. The clock circuit 504 is coupled to the clock terminal 514 and the inverted clock terminal 516 of an initial bridge 508. The power supply 506 is coupled to the input terminal 510 and the inverted input terminal 512 of the bridges 50. In one embodiment of the present invention, the clock circuit 504 comprises an optical pulse injector 302, 402 or 432, as described above in connection with FIGS. 8, 9 and 10. Thus, the oscillator 500 may be phase-locked to an optical pulse. It will be understood, however, that any suitable clock circuit 504 capable of providing a clock signal to the oscillator 500 may be utilized without departing from the scope of the present invention.

The clock terminals 514 and inverted clock terminals 516 of the bridges 50 are coupled to each other through transmission lines 502. Generally, the clock terminal 514 of a bridge 50 is coupled to the clock terminal 514 of an adjacent bridge 50, and the inverted clock terminal 516 of the bridge 50 is coupled to the inverted clock terminal 514 of the adjacent bridge 50. However, the clock terminal 514 of a final bridge 520 is coupled to the inverted clock terminal 516 of the initial bridge 508, and the inverted clock terminal 516 of the final bridge 520 is coupled to the clock terminal 514 of the initial bridge 508. Therefore, the clock signal is passed from the clock terminal 514 of the initial bridge 508, through a plurality of transmission lines 502 to clock terminals 514 of other bridges 50, and returns to the inverted clock terminal 516 of the initial bridge 508. The signal then is passed through the transmission lines 502 to the inverted clock terminals 516 of the other bridges 50 and eventually returns to the clock terminal 514 of the initial bridge 508. The clock signals at the clock terminals 514 and the inverted clock terminals 516 of the bridges 50 thus oscillate between high and low as the signals travel around the ring.

The input terminal 510 of the initial bridge 508 is coupled to the input terminals 510 of the other bridges 50, and the inverted input terminal 512 of the initial bridge 508 is coupled to the inverted input terminals 512 of the other bridges 50. Thus, power is supplied to each bridge 50 of the oscillator 500 from the power supply 506 through the input terminals 510 and inverted input terminals 512.

Figure 12:
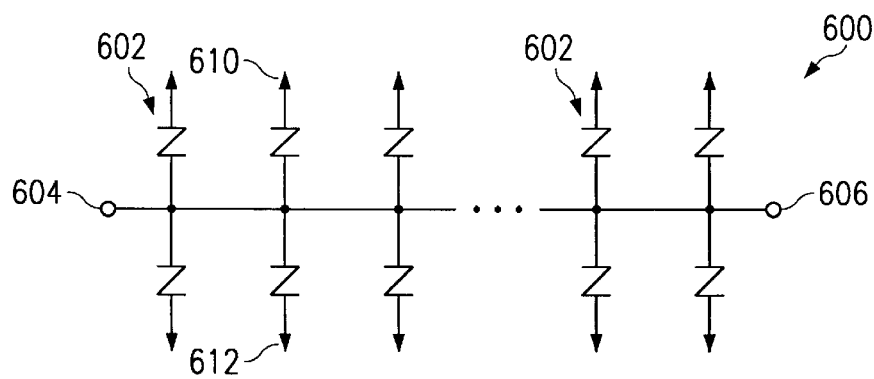
FIG. 12 is a circuit diagram illustrating a transmission line constructed in accordance with the teachings of the present invention.

FIG. 12 is a circuit diagram illustrating a transmission line 600 constructed in accordance with the teachings of the present invention. The transmission line 600 comprises a plurality of RTD pairs 602 distributed evenly along the transmission line 600. The transmission line 600 also comprises an input terminal 604 and an output terminal 606. An input signal is received at the input terminal 604, and an output signal is provided at the output terminal 606.

Each RTD pair 602 comprises a first power supply terminal 610 and a second power supply terminal 612. In accordance with one embodiment of the present invention, the first power supply terminal 610 and the second power supply terminal 612 are coupled to power supplies. Alternatively, one of the power supply terminals 610 or 612 is coupled to a power supply, and the other power supply terminal 610 or 612 is grounded.

Figure 13:
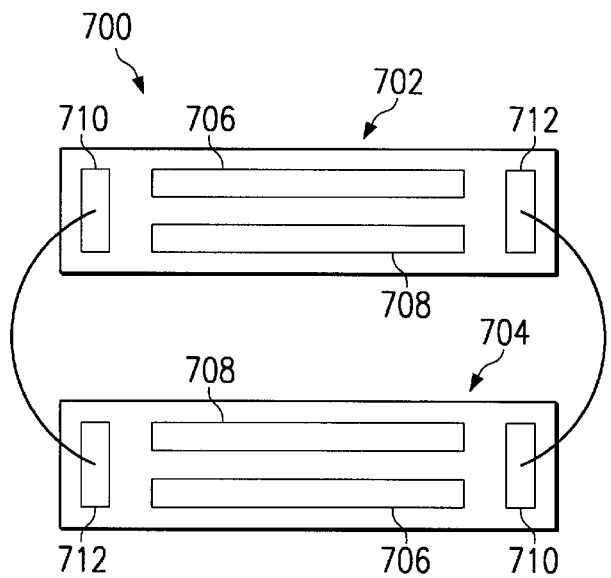
FIG. 13 is a circuit diagram illustrating an oscillator including the transmission line of FIG. 12 in accordance with one embodiment of the present invention.

FIG. 13 is a circuit diagram illustrating an oscillator 700 including a transmission line in accordance with one embodiment of the present invention. The oscillator 700 includes a first transmission line 702 coupled to a second transmission line 704. The transmission lines 702 and 704 comprise a first continuous RTD 706 and a second continuous RTD 708. The transmission lines 702 and 704 further comprise an input terminal 710 and an output terminal 712. The output terminal 712 of the first transmission line 702 is coupled to the input terminal 710 of the second transmission line 704. Likewise, the output terminal 712 of the second transmission line 704 is coupled to the input terminal 710 of the first transmission line 702. The transmission lines 702 and 704 may be formed similar to the transmission line 600 illustrated in FIG. 12. As the RTD pairs 602 are formed more densely along the transmission line 600, eventually they become so dense as to form continuous RTDs, such as the continuous RTDs 706 and 708 illustrated in FIG. 13.

Figure 14:
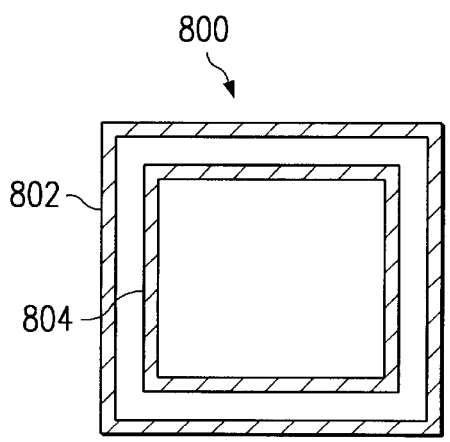
FIG. 14 is a circuit diagram illustrating an oscillator including the transmission line of FIG. 12 in accordance with another embodiment of the present invention.

FIG. 14 is a circuit diagram illustrating an oscillator 800 including a transmission line in accordance with another embodiment of the present invention. The oscillator 800 comprises a first continuous RTD 802 and a second continuous RTD 804. As described above in connection with FIG. 13, these continuous RTDs 802 and 804 may be formed similar to the transmission line 600 illustrated in FIG. 12 by forming the RTD pairs 602 densely enough to become continuous RTDs 802 and 804. The oscillator 800 functions similarly to the oscillator 700 shown in FIG. 13, without requiring input terminals or output terminals to couple the continuous RTDs 802 and 804 to each other. Instead, the continuous RTDs 802 and 804 form a ring, as shown in FIG. 14.

Figure 15A:
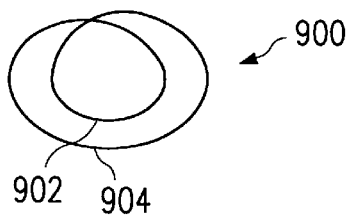
FIGS. 15A–C illustrate a method for generating multi-phase outputs utilizing the oscillators of FIGS. 11, 13 and 14.
Figure 15B:
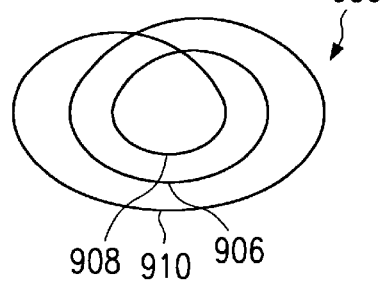
Figure 15C:
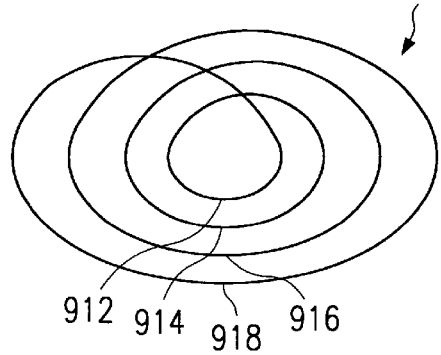

FIGS. 15A–C illustrate loops 900, 930 and 960 of oscillators for generating multi-phase outputs. FIG. 15A illustrates a two-phase oscillator having two loops. FIG. 15B illustrates a three-phase oscillator having three loops. FIG. 15C illustrates a four-phase oscillator having four loops. It will be understood that the oscillator may be configured to have any number of loops in accordance with the requirements of any particular application without departing from the scope of the present invention. In accordance with the teachings of the present invention, the loops 900, 930 and 960 may comprise any one of the oscillators 500, 700 or 800 shown in FIGS. 11, 13 or 14.

Oscillators folded as shown in FIGS. 15A–C may generate multi-phase outputs at the output terminals 902, 904, 906, 908, 910, 912, 914, 916, and 918. As described above in connection with FIG. 11, the oscillators may comprise transmission lines that provide a phase shift to the signal traveling through the oscillator. For example, in one configuration of the loop 900 shown in FIG. 15A, an output signal at output terminal 902 is phase shifted 180° from an output signal at output terminal 904. Similarly, the loop 930 shown in FIG. 15B may provide an output signal at the output terminal 906 that is phase shifted 120° from an output signal at the output terminal 908 and phase shifted 240° from an output signal at the output terminal 910. Finally, the loop 960 shown in FIG. 15C in one configuration provides an output signal at the output terminal 912 that is phase shifted 90° from an output signal at the output terminal 914, and phase shifted 180° from an output signal at the output terminal 916, and phase shifted 270° from an output signal at the output terminal 918.

The loops 900, 930 and 960 are coupled to a clock circuit (not shown). As described above in connection with FIG. 11, this clock circuit may comprise an optical pulse injector 302, 402 or 432, or other suitable clock circuitry. In addition, the clock circuit may be capacitively coupled to the loops 900, 930 and 960.

Although the present invention has been described with several embodiments, various changes and modifications may be suggested in the art. It is intended that the present invention encompass such changes and modifications as fall within the scope of the appended claims.

What is claimed is:

1. A system for storing digital data comprising:
   a bridge comprising a plurality of negative differential resistance devices for storing a data input signal;
   an input circuit receiving the data input signal and coupling the data input signal to said bridge; and
   a clock circuit receiving a clock signal and coupling the clock signal to said bridge.

2. The system of claim 1, wherein the input circuit comprises an input follower.

3. The system of claim 1, wherein the input circuit comprises a first input follower and a second input follower.

4. The system of claim 1, wherein the input circuit comprises a resistor.

5. The system of claim 1, wherein each of the negative differential resistance devices comprises a resonant tunneling diode.

6. The system of claim 1, wherein each of the negative differential resistance devices comprises a first resonant tunneling diode in parallel with a second resonant tunneling diode, the first resonant tunneling diode oppositely biased with reference to the second resonant tunneling diode.

7. The system of claim 1, wherein the bridge further comprises:
   a first terminal coupled to receive a first output from the input circuit, a second terminal coupled to receive a second output from the input circuit, a third terminal receiving a first clock signal, and a fourth terminal receiving a second clock signal from the clock circuit;
   a first negative differential resistance device coupled to the first and third terminals of the bridge;
   a second negative differential resistance device coupled to the first and fourth terminals of the bridge;
   a third negative differential resistance device coupled to the second and third terminals of the bridge; and
   a fourth negative differential resistance device coupled to the second and fourth terminals of the bridge.

8. The system of claim 7, wherein the bridge further comprises a fifth negative differential resistance device coupled to the third and fourth terminals of the bridge.

9. A digital data shift register comprising:
   a first stage comprising an input circuit receiving first and second input signals and generating first and second digital data signals, and a bridge comprising a plurality of negative differential resistance devices, the bridge connected to the input circuit and receiving the first and second digital data signals at first and second input terminals, the bridge receiving a clock signal and having a first output signal and a second output signal;
   at least one additional stage, each additional stage comprising an input circuit having first and second input terminals and generating first and second digital data signals, a bridge comprising a plurality of negative differential resistance devices, the bridge connected to the input circuit and receiving the first and second digital data signals, the bridge receiving a clock signal and having a first output signal and a second output signal; and
   means for coupling the first output signal of one stage to the first input terminal of the input circuit of an adjacent stage and the second output signal of the one stage to the second input terminal of the input circuit of the adjacent stage.

10. The digital data shift register of claim 9, wherein the input circuit of each stage comprises an input follower.

11. The digital data shift register of claim 9, further comprising a clock producing multi-phase clock signals coupled to said stages, the clock signal received at one stage having a 90 degree phase shift from the clock signal received at an adjacent stage.

12. The digital data shift register of claim 9, wherein the input circuit comprises a resistor.

13. The digital data shift register of claim 9, further comprising a multi-phase clock producing 60 degree phase shifted clock signals, the clock signal received at one stage having a 60 degree phase shift from the clock signal received at an adjacent stage.

14. The digital data shift register of claim 9, wherein each of the negative differential resistance devices comprises a resonant tunneling diode.

15. The digital data shift register of claim 9, wherein each of the negative differential resistance devices comprises a first resonant tunneling diode in parallel with a second resonant tunneling diode, the first resonant tunneling diode oppositely biased with reference to the second resonant tunneling diode.

16. The digital data shift register of claim 9, wherein
   the clock signal comprises a non-inverted clock signal and an inverted clock signal;
   the input circuit further comprises a first terminal coupled to receive the first input signal, a second terminal coupled to receive the second input signal, a third terminal providing the first digital data signal, and a fourth terminal providing the second digital data signal;
   further comprising a clock circuit having a first terminal coupled to receive the non-inverted clock signal, a second terminal coupled to receive the inverted clock signal, a third terminal providing a first clock signal, and a fourth terminal providing a second clock signal;
   the bridge further comprises a first terminal coupled to receive the first digital data signal, a second terminal coupled to receive the second digital data signal, a third terminal coupled to receive the first clock signal, and a fourth terminal coupled to receive the second clock signal; and
   the means for coupling comprises a first output terminal coupled to the first terminal of the bridge and a second output terminal coupled to the second terminal of the bridge.

17. The shift register of claim 16, wherein
   the input circuit further comprises a first input follower and a second input follower, the first and second input followers each comprising a first terminal and a second terminal;
   the first terminal of the first input follower comprises the first terminal of the input circuit and the second terminal of the first input follower comprises the third terminal of the input circuit; and
   the first terminal of the second input follower comprises the second terminal of the input circuit and the second terminal of the second input follower comprises the fourth terminal of the buffer.

18. The shift register of claim 16, wherein the bridge further comprises:

a first negative differential resistance device coupled to the first and third terminals of the bridge;

a second negative differential resistance device coupled to the first and fourth terminals of the bridge;

a third negative differential resistance device coupled to the second and third terminals of the bridge;

a fourth negative differential resistance device coupled to the second and fourth terminals of the bridge; and a fifth negative differential resistance device coupled to the third and fourth terminals of the bridge.

19. A method for storing digital data comprising:

receiving an input signal;

processing the input signal;

receiving a clock signal; and storing in a bridge comprising a plurality of negative differential resistance devices the input signal in response to the received clock signal.

20. The method of claim 19, wherein each of the negative differential resistance devices comprises a resonant tunneling diode.

21. The method of claim 19, wherein each of the negative differential resistance devices comprises a first resonant tunneling diode in parallel with a second resonant tunneling diode, and further comprising oppositely biasing the first resonant tunneling diode with reference to the second resonant tunneling diode.

22. The method of claim 19, wherein the input signal comprises a first input signal and a second input signal and further comprising:

receiving the first input signal at a first input terminal of an input circuit;

receiving the second input signal at a second input terminal of the input circuit;

generating a first output signal at a first output terminal of the input circuit;

generating a second output signal at a second output terminal of the input circuit; and applying the first output signal and the second output signal to said bridge.

23. A method for storing data in a plurality of interconnected stages, the storing of data in each stage comprising:

receiving an input signal;

processing the input signal;

receiving a clock signal;

storing in a bridge comprising a plurality of negative differential resistance devices the input signal in response to the received clock signal; and transferring the stored input signal to the adjacent one of the plurality of interconnected stages.

24. The method of claim 23, further comprising:

generating a multi-phase clock producing clock signals of a first phase and a second phase;

applying the clock signal of the first phase to a first stage; and applying the clock signal of the second phase to a second stage, the second stage adjacent to the first stage.

25. The method of claim 23, further comprising:

generating a multi-phase clock producing clock signals of a first phase, a second phase, and a third phase;

applying the clock signal of the first phase to a first stage;

applying the clock signal of the second phase to a second stage, the second stage adjacent to the first stage; and applying the clock signal of the third phase to a third stage, the third stage adjacent stage to the second stage.

* * * * *